US008835884B2

(12) United States Patent
Arai

(10) Patent No.: US 8,835,884 B2
(45) Date of Patent: Sep. 16, 2014

(54) CHARGED PARTICLE BEAM APPARATUS WITH CLEANING PHOTO-IRRADIATION APPARATUS

(75) Inventor: Noriaki Arai, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/994,812

(22) PCT Filed: Dec. 8, 2011

(86) PCT No.: PCT/JP2011/078372
§ 371 (c)(1),
(2), (4) Date: Jun. 17, 2013

(87) PCT Pub. No.: WO2012/086419
PCT Pub. Date: Jun. 28, 2012

(65) Prior Publication Data
US 2013/0264496 A1  Oct. 10, 2013

(30) Foreign Application Priority Data
Dec. 22, 2010  (JP) ................................. 2010-286355

(51) Int. Cl.
| H01J 37/06 | (2006.01) |
| H01J 49/00 | (2006.01) |
| H01J 29/00 | (2006.01) |
| H01J 49/26 | (2006.01) |
| H01J 27/02 | (2006.01) |

(52) U.S. Cl.
CPC ............... *H01J 27/022* (2013.01); *H01J 37/06* (2013.01); *H01J 2237/0802* (2013.01); *H01J 29/00* (2013.01); *H01J 49/26* (2013.01); *H01J 2237/06341* (2013.01); *H01J 2237/022* (2013.01)
USPC ................... 250/492.3; 250/396 R; 250/307; 250/424; 250/489; 250/492.2; 313/309; 313/495

(58) Field of Classification Search
CPC ........... H01J 37/06; H01J 37/08; H01J 30/06; H01J 30/261; H01J 49/48
USPC ....... 250/396 R, 307, 424, 489, 492.2, 492.3; 313/309, 495
See application file for complete search history.

(56) References Cited

U.S. PATENT DOCUMENTS 5,491,375 A      2/1996  Iwasaki
7,633,074 B2 *  12/2009  Frosien .................... 250/492.23
(Continued)

FOREIGN PATENT DOCUMENTS

JP      5-114353      5/1993
JP      7-153403      6/1995
(Continued)

*Primary Examiner* — David A Vanore
(74) *Attorney, Agent, or Firm* — Antonelli, Terry, Stout & Kraus, LLP.

(57) ABSTRACT

A charged particle beam apparatus including a charged particle emission gun with which cleaning of a tip is possible without stopping the operation of the charged particle emission gun for a long time and without heating the tip. The charged particle emission gun includes a cleaning photo-irradiation apparatus that generates ultraviolet light or infrared light to irradiate a tip, and an optical fiber for guiding the ultraviolet light or the infrared light toward the tip. The cleaning photo-irradiation apparatus generates ultraviolet light or an infrared light with a predetermined wavelength and intensity to desorb a molecule adsorbed on the tip through photon stimulated desorption, or to desorb a molecule adsorbed on the tip through photon stimulated desorption and ionize the desorbed molecule.

20 Claims, 9 Drawing Sheets

(56) References Cited

U.S. PATENT DOCUMENTS

| | | | |
|---|---|---|---|
| 2007/0001574 A1* | 1/2007 | Zhou et al. | 313/309 |
| 2007/0018562 A1* | 1/2007 | Adamec et al. | 313/495 |
| 2007/0085035 A1* | 4/2007 | Frosien | 250/492.3 |
| 2007/0158588 A1 | 7/2007 | Zhou et al. | |
| 2008/0217555 A1 | 9/2008 | Ward et al. | |
| 2009/0200497 A1* | 8/2009 | Adamec et al. | 250/503.1 |
| 2013/0264496 A1* | 10/2013 | Arai | 250/489 |

FOREIGN PATENT DOCUMENTS

| | | |
|---|---|---|
| JP | 7-182969 | 7/1995 |
| JP | 11-7913 | 1/1999 |
| JP | 2007-73521 | 3/2007 |
| JP | 2009-289670 | 12/2009 |

\* cited by examiner

US 8,835,884 B2

CHARGED PARTICLE BEAM APPARATUS WITH CLEANING PHOTO-IRRADIATION APPARATUS

TECHNICAL FIELD

The present invention relates to a charged particle emission source with a needle-shaped electrode cooled to an ultralow temperature, and a charged particle beam apparatus.

BACKGROUND ART

As an electron gun for an electron microscope, a thermionic source, a Schottky electron source, a cold cathode field emission source, and the like are known. Among such electron sources, the cold cathode field emission source is a monochromatic electron source with the highest brightness, and is used for an ultrahigh resolution electron microscope. The cold cathode field emission source uses a needle-shaped tungsten tip in a non-heated state to generate an electric field with high intensity, and thus generates electrons through the tunnel effect.

Typically, the energy width of an electron beam at room temperature is greater than or equal to 200 meV (half-width) even on the ideal clean surface. However, when an electron source is used at an ultralow temperature, the energy width of an electron beam can be narrowed. For example, in the case of an electron source that uses a tungsten tip, the energy width at room temperature (300 K) is about 200 meV, but the energy width at the liquid nitrogen temperature (about 77 K) is about 120 meV, and that at the liquid hydrogen temperature (about 21 K) is about 110 meV. That is, at an ultralow temperature, the energy width can be reduced to about a half that at room temperature. Consequently, chromatic aberrations of a lens generated in the optical system of the electron microscope are reduced by half. Thus, an electron beam can be narrowed to a smaller optical beam diameter.

Meanwhile, as an ion gun for an ion microscope, a gas field ionization ion source (GFIS) is known. In the gas field ionization ion source, a strong electric field is typically caused to be generated at the end portion of a needle-shaped electrode (tip) set at an ultralow temperature that is less than or equal to the liquid nitrogen temperature, as with the cold cathode field emission source. A source gas is supplied to the periphery of the tip so that the source gas is ionized by the tunnel effect of electrons between the tip and gas molecules. For the source gas, a noble gas is used. In recent years, a helium ion microscope that uses helium ions as a probe has drawn attention. As helium ions are heavier than electrons, it is possible to reduce the wavelength and reduce the diffraction aberrations. Thus, a microscope that is far superior to a scanning electron microscope (SEM) in the resolution and the depth of focus can be obtained.

Note that a voltage applied to a tip of an ion gun is typically a positive voltage, and is opposite to that of an electron gun. That is, ions are emitted at negative potentials relative to the tip, but electrons are emitted at positive potentials relative to the tip.

For a focused ion beam (FIB) apparatus, liquid metal ions typified by gallium have been conventionally used. However, when neon (Ne), argon (Ar), or the like is used instead of the liquid metal ions, it is possible to conduct a precise sputtering process with small damage.

Patent Literature 1 discloses a cleaning method that uses an ultraviolet laser to prevent adsorption of the residual gas onto an electron source in a vacuum. Patent Literature 2 discloses a technology of a microscope having a commercialized gas field ionization ion source (GFIS) mounted thereon.

CITATION LIST

Patent Literature

Patent Literature 1: JP Paten Publication No. 11-07913A (1999)
Patent Literature 2: United States Patent No. 2008/0217555 A

SUMMARY OF INVENTION

Technical Problem

When a tip is used in an ultrahigh vacuum for a long time, the residual gas (mainly hydrogen and carbon monoxide) in the ultrahigh vacuum is adsorbed onto the tip, resulting in an increase of noise in the emitted current, a decrease in the amount of current with time, and the like. Thus, stability as a probe is spoiled. Therefore, in order to prevent contamination of the tip with the adsorbed gas, it is necessary to clean the tip.

Conventionally, in an electron gun that uses a cold cathode field emission source, a tip is cleaned by being instantaneously heated with a current supplied thereto (flashing). However, rapidly changing a tip at an ultralow temperature to a high temperature is not preferable as this would cause breaking of the tip or dulling of the end of the tip due to thermal stress. Further, when flashing is performed, it is necessary to stop the emission of charged particles for a relatively long time.

The present invention aims at providing a charged particle emission gun with which cleaning of a tip is possible without stopping the operation of the charged particle emission gun for a long time and without heating the tip.

Solution to Problem

A charged particle emission gun of the present invention includes a tip; an extracting electrode having a central hole that is coaxial with the tip; an ion collector arranged between the tip and the extracting electrode, the ion collector having a central hole that is coaxial with the tip; a vacuum chamber that accommodates therein the tip, the extracting electrode, and the ion collector; a cooling apparatus for cooling the tip; and a cleaning photo-irradiation apparatus that generates ultraviolet light or infrared light to irradiate the tip.

The cleaning photo-irradiation apparatus generates ultraviolet light or infrared light with a predetermined wavelength to desorb a molecule adsorbed on the tip through photon stimulated desorption, or to desorb a molecule adsorbed on the tip through photon stimulated desorption and ionize the desorbed molecule.

The cleaning photo-irradiation apparatus uses a lamp light source that generates light with a continuous spectrum or a laser source that generates a pulsed light.

When a lamp light source is used, the adsorbed gas is subjected to photon stimulated desorption, and then the desorbed molecule is exhausted or is ionized and trapped by an ion collector. When a laser source is used, the tip is irradiated with light with a pulse width of femtoseconds and a light intensity on the order of $10^{10}$ W/cm$^2$ so that the tip is cleaned through photon stimulated desorption and REMPI (Resonance Enhanced Multi Photon Ionization).

Advantageous Effects of Invention

According to the charged particle emission gun of the present invention, cleaning of a tip is possible without stopping the operation of the charged particle emission gun for a long time and without heating the tip.

DESCRIPTION OF EMBODIMENTS

Figure 1:
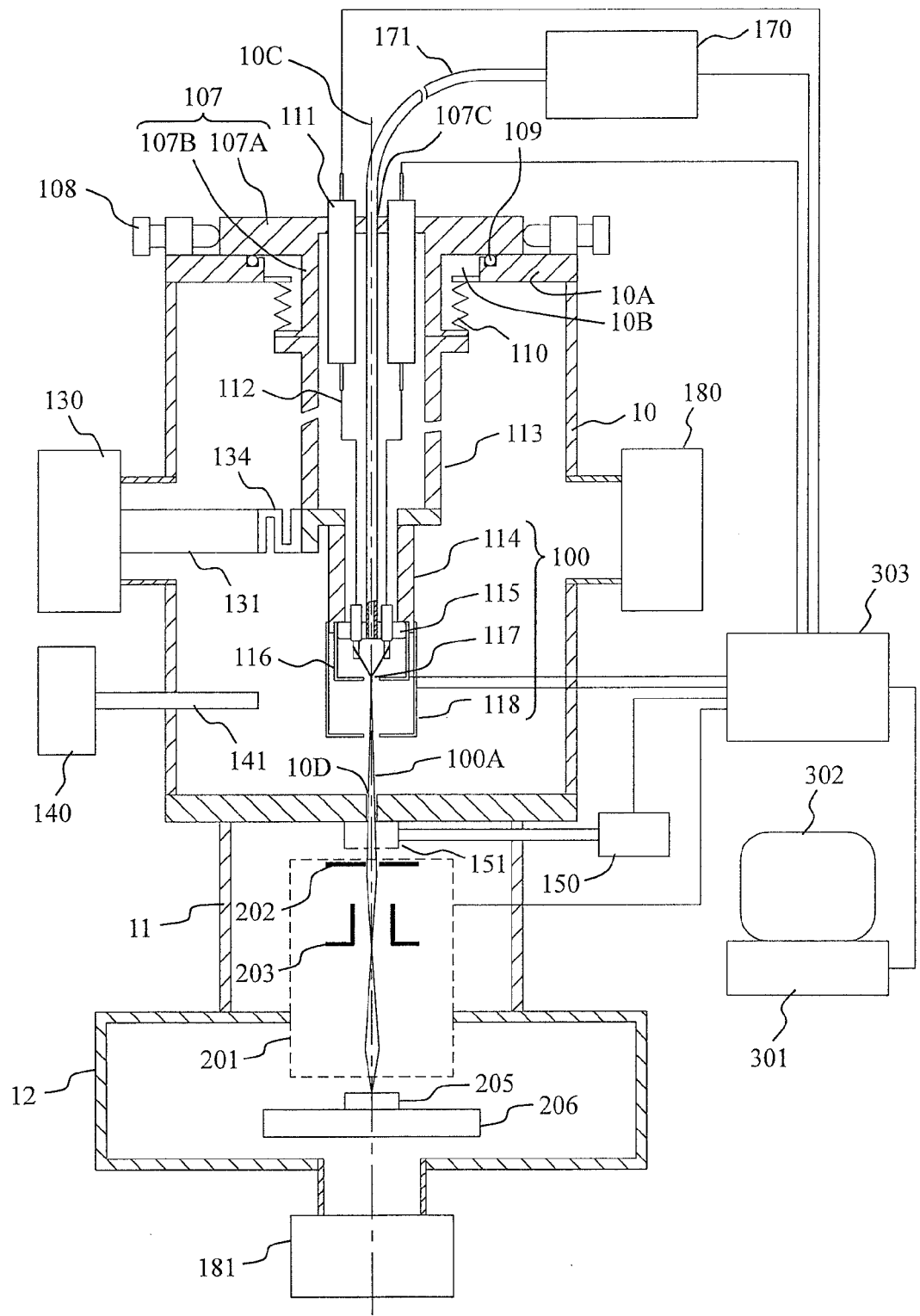
FIG. 1 is a view illustrating the cross-sectional structure of a primary part of a first example of a charged particle beam apparatus of the present invention.

A first example of a charged particle beam apparatus in accordance with the present invention will be described with reference to FIG. 1. The charged particle beam apparatus of the present example includes a vacuum chamber 10, a vacuum chamber 11 for an optical system, and a specimen chamber 12, and further includes a control unit 303 for power supply, a control computer 301, and a display device 302. The vacuum chamber 10 has mounted thereon a vacuum pump 180 and a cooling apparatus 130. Further, a cleaning photo-irradiation apparatus 170 and a gas supply apparatus 140 are provided around the vacuum chamber 10. A vacuum pump 181 is mounted on the bottom side of the specimen chamber 12.

Hereinafter, a portion other than the vacuum chamber 11 for the optical system and the specimen chamber 12 of the charged particle beam apparatus of the present example will be referred to as a charged particle emission gun. The charged particle emission gun of the present example can be used as an electron gun or an ion gun. In particular, the charged particle emission gun of the present example can be used as a cold cathode field emission source, which operates at an ultralow temperature, or a gas field ionization ion source (GFIS). Further, the charged particle emission gun of the present example can also be used as an ion source of a focused ion beam apparatus (FIB).

When the charged particle emission gun of the present example is used as an electron gun, an electron optical system may be provided in the vacuum chamber 11 for the optical system, and a specimen stage may be provided in the specimen chamber 12. Accordingly, an ultrahigh resolution electron microscope is formed. When the charged particle emission gun of the present example is used as an ion gun, an ion optical system may be provided in the vacuum chamber 11 for the optical system, and a specimen stage for an ion microscope or a focused ion beam may be provided in the specimen chamber 12. Accordingly, an ion microscope or a focused ion beam apparatus (FIB) is formed.

The inside of the vacuum chamber 10 is evacuated by the vacuum pump 180. Accordingly, a high vacuum on the order of $10^{-6}$ Pa or less can be easily obtained in the vacuum chamber 10. However, when the charged particle emission gun is subjected to thermal treatment (baking), an ultrahigh vacuum on the order of $10^{-8}$ Pa or less can be obtained. Thermal treatment (baking) is a process of degassing the adsorbed gas and the absorbed gas on the members, which constitute the charged particle emission gun, in the vacuum chamber 10.

A support structure 107 is provided on a ceiling 10A of the vacuum chamber 10. The support structure 107 has a flange portion 107A and a cylindrical portion 107B. The flange portion 107A of the support structure 107 is supported by the upper face of the ceiling 10A of the vacuum chamber 10. A seal member 109 such as an O-ring is attached between the lower face of the flange portion 107A of the support structure 107 and the upper face of the ceiling 10A of the vacuum chamber 10. The cylindrical portion 107B of the support structure 107 is inserted into a hole 10B of the ceiling 10A of the vacuum chamber 10.

A holder 114 is attached to the bottom end of the cylindrical portion 107B of the support structure 107 with a thermal insulation structure 113 interposed therebetween. The holder 114 has mounted thereon an insulator 115 of a tip, an ion collector 116 made of metal, and an extracting electrode 118. A tip 117 is attached to the insulator 115 of the tip. In the present example, the holder 114, the insulator 115 of the tip, the tip 117, the ion collector 116, and the extracting electrode 118 form a tip unit 100. The thermal insulation structure 113 and the tip unit 100 are supported in a state in which they are hung on the support structure 107. The structure and the operation of the tip unit 100 will be described in detail later with reference to FIG. 2.

The inner diameter of the hole 10B of the ceiling 10A of the vacuum chamber 10 is larger than the outer diameter of the cylindrical portion 107B of the support structure 107. The support structure 107 can move in the horizontal direction with respect to the vacuum chamber 10 by an amount corresponding to the difference in diameter. A screw 108 for moving the tip abuts the outer circumferential surface of the flange portion 107A of the support structure 107. The screw 108 is rotated to move in the radial direction, whereby the support structure 107 moves in the horizontal direction with respect to the vacuum chamber 10. Accordingly, the optical axis of the tip can be aligned with the central axis line 10C of the vacuum chamber 10.

The ceiling 10A of the vacuum chamber 10 and the outer circumference of the thermal insulation structure 113 are connected with bellows 110. The bellows 110 are arranged in a manner that surrounds the cylindrical portion 107B of the support structure 107. The bellows 110 seal a gap between the lower face of the flange portion 107A of the support structure 107 and the upper face of the ceiling 10A of the vacuum chamber 10.

An insulated feedthrough 111 of high voltage is attached to the support structure 107. An electric wire 112 connected to the control unit 303 for power supply is introduced into the vacuum chamber 10 via the insulated feedthrough 111 of high voltage, and an end of the electric wire 112 is connected to the tip 117. A high voltage (a maximum of about ±40 kV) is applied to the tip 117 via the electric wire. Note that the ion collector 116 and the extracting electrode 118 are connected to the control unit 303 for power supply via electric wires. Desired high voltages are applied to the ion collector 116 and the extracting electrode 118 via the electric wires.

The temperature of the flange portion 107A of the support structure 107 is room temperature, but the tip 117 is cooled to an ultralow temperature. The thermal insulation structure 113 is configured such that heat from the outside does not flow onto the tip 117 via the support structure 107. The thermal insulation structure 113 is fanned of a metal cylinder with a thin thickness (about 0.3 mm) or a plurality of thin metal cylindrical pipes to reduce the amount of the inflow of heat. As the material of the thermal insulation structure 113, a super invar with low thermal conductivity and a low linear expansion coefficient may be used. Accordingly, thermal shrinkage of the vacuum chamber 10 in the direction of the central axis line 10C can be practically suppressed to a negligible level. As the material of the thermal insulation structure 113, alumina of ceramic with low thermal conductivity and a low linear expansion coefficient can also be used, for example. Further, as the material of the thermal insulation structure 113, heat-resistant plastic that can resist thermal treatment (baking), for example, polytetrafluoroethylene (PTFE) or polyphenylene sulfide (PPS) can also be used, but such materials are not suitable when a mechanical strength is required.

The distance between the cylindrical portion 107B of the support structure 107 and the insulator 115 of the tip is set to a dimension that is necessary for thermal insulation so that heat from the outside does not flow onto the tip 117 via the support structure 107. In this example, the distance between the cylindrical portion 107B of the support structure 107 and the insulator 115 of the tip is about 100 mm. Although there is a possibility that heat from the outside may flow onto the tip 117 via the electric wire 112, using a thin wire for the electric wire 112 can prevent the inflow of heat.

The cooling mechanism of the tip 117 will be described. The cooling apparatus 130 includes a main body portion that generates mechanical oscillation and a cold end 131 that circulates the cooled gas supplied from the main body portion. In the present example, the main body portion of the cooling apparatus 130 is arranged outside the vacuum chamber 10, and the cold end 131 is arranged inside the vacuum chamber 10. The inner end of the cold end 131 is connected to the holder 114 via a net wire 134. The net wire 134 may be formed of a material with high thermal conductivity, for example, oxygen-free copper. As the mechanical oscillation of the main body portion of the cooling apparatus 130 is attenuated by the net wire 134, the oscillation will not be transmitted to the tip 117.

In order to generate an electron beam with a narrow energy width or an ion beam with high brightness, it is necessary to cool the tip to an ultralow temperature, desirably to a temperature less than or equal to the liquid nitrogen temperature of 77 K. In the present example, the refrigerating capacity of the cooling apparatus 130 is about 10 W at 70 K, and the tip 117 can be cooled to about 70 K.

The photo-irradiation apparatus 170 for cleaning the tip will be described. The cleaning photo-irradiation apparatus 170 generates irradiation light for cleaning the tip. The irradiation light for cleaning the tip has a function of causing photon stimulated desorption of the adsorbed molecules adsorbed on the tip, and further ionizing the desorbed molecules that have undergone the photon stimulated desorption. For the cleaning irradiation light, infrared light or ultraviolet light with a predetermined wavelength and intensity is used. As an infrared source that generates the infrared light, an infrared lamp or an infrared laser source may be used. As an ultraviolet source that generates the ultraviolet light, a vacuum ultraviolet lamp or an ultraviolet laser source may be used. As a vacuum ultraviolet lamp, a deuterium lamp may be used.

An optical fiber 171 is connected to the cleaning photo-irradiation apparatus 170. The optical fiber 171 may be a hollow optical fiber. The optical fiber 171 extends along the central axis line of the support structure 107 and the thermal insulation structure 113, and the inner end thereof penetrates the insulator 115 of the tip and faces the end of the tip 117. The central axis line of the optical fiber 171, that is, the optical axis of the optical fiber 171 is aligned with the optical axis of an electron beam or an ion beam generated by the tip 117. That is, the central axis line of the optical fiber 171 and the optical axis of the electron beam or the ion beam are coaxially arranged. Provided that the central axis line 10C of the vacuum chamber 10 is a Z-axis, the central axis line of the optical fiber 171 and the optical axis of the electron beam or the ion beam are arranged along the Z-axis.

The infrared light or the ultraviolet light from the cleaning photo-irradiation apparatus 170 irradiates the end of the tip 117 via the optical fiber 171. Using the optical fiber 171 can eliminate the necessity of directly mounting optics such as an optical window or lenses on the vacuum chamber.

The support structure 107 has formed therein a hole 107C for the passage of the optical fiber 171. A commercially available vacuum sealing flange may be used for sealing a gap between the optical fiber 171 and the hole 107C of the support structure 107. The seal structure for the cleaning photo-irradiation apparatus 170 and the optical fiber 171 will be described later with reference to FIG. 8. For the material of the optical fiber 171, quartz, which is an insulating material, is used. Therefore, electrical insulation between the insulator 115 of the tip and the support structure 107, which is at the ground potential, is enabled by the optical fiber 171.

A gas supply pipe 141 is connected to the gas supply apparatus 140. The gas supply pipe 141 is arranged in the vacuum chamber 10, and the inner end thereof faces a region of the end of the tip 117. The inside of the gas supply apparatus 140 is provided with high-purity gas cylinders as well as valves and a purifier for controlling the gas cylinders. For the purifier, a getter material that uses a commercially available chemically active alloy may be used. Accordingly, the concentration of impurities can be reduced to the level of 1 ppb. Thus, a gas with the impurities removed can be supplied to the vacuum chamber 10 via the gas supply pipe 141 from the gas supply apparatus 140.

When the charged particle emission gun of the present example is used as an ion gun, a source gas is supplied using the gas supply apparatus 140. For the source gas, a noble gas such as helium (He), neon (Ne), or argon (Ar) is typically used. However, another gas may also be used as long as it is ionized with a lower field intensity than the field intensity necessary for the field evaporation of the tip material. For example, hydrogen ($H_2$), nitrogen ($N_2$), oxygen ($O_2$), or the like may be used. In recent years, a helium ion microscope, which is a high resolution microscope, has become commercially available, replacing a scanning electron microscope. In the helium ion microscope, helium (He) is used as a probe gas. Further, using $H_2$ ions or H ions as a probe gas can realize a microscope with small damage and high resolution.

The pressure of the supplied source gas is about 0.01 to 0.1 Pa. Thus, the concentration of impurities in the supplied source gas is reduced to the partial pressure in an ultrahigh vacuum on the order of 1E-11 to 1E-10 Pa.

When the charged particle emission gun of the present example is used as an electron gun, the gas supply apparatus 140 is basically not necessary. However, in order to intentionally dull the shape of the end of the tip and achieve sharpening (including formation of a nano-pyramid), oxygen ($O_2$) or nitrogen ($N_2$) or a mixed gas thereof may also be supplied using the gas supply apparatus 140.

The vacuum chamber 10 has a hole 10D formed in the bottom wall thereof. A charged particle beam 100A generated by the tip 117 is supplied to the vacuum chamber 11 for the optical system via the hole 10D in the bottom wall of the vacuum chamber 10. This hole 10D has a valve 151 attached thereto. The valve 151 is attached to the lower face of the bottom wall of the vacuum chamber 10, that is, on the ceiling of the vacuum chamber 11 for the optical system. The valve 151 is adapted to, when opened, connect the vacuum chamber 10 and the vacuum chamber 11 for the optical system and, when closed, disconnect the vacuum chamber 10 and the vacuum chamber 11 for the optical system. Opening and closing of the valve 151 are controlled by a valve driving apparatus 150. The valve driving apparatus 150 is controlled by the control unit 303 for power supply.

An optical system 201 is provided in the vacuum chamber 11 for the optical system. The optical system 201 may basically be an electron optical system or an ion optical system, including lenses (not shown) or an aligner for shaping or controlling the beam trajectory of the charged particle beam 100A. Further, the optical system 201 of the present example includes an aperture 202 and a beam blanker 203. The aperture 202 has a hole with a minute diameter, and is configured to obtain a predetermined divergence angle and current amount of the charged particle beam by partially blocking the charged particle beam. The beam blanker 203 has a function of electromagnetically or electrostatically deflecting the charged particle beam 100A. The aperture 202 and the beam blanker 203 also have a function of reducing scattered electrons or scattered ions described below.

A specimen stage 206 is provided in the specimen chamber 12, and a specimen 205 is disposed thereon. The inside of the vacuum chamber 11 for the optical system and the specimen chamber 12 is evacuated by the vacuum pump 181.

The control computer 301 controls the application of a high voltage to each electrode of the charged particle emission gun, evacuation of the vacuum chambers 10, 11, and 12, and the like. Further, the control computer 301 integrally drives and controls the cooling apparatus 130, the gas supply apparatus 140, the valve driving apparatus 150, the cleaning photo-irradiation apparatus 170, the electron/ion optical system 201, and the specimen stage 206. The display device 302 displays a GUI (Graphical User Interface). The control computer 301 is connected to the control unit 303 for power supply, and can operate each of the aforementioned control individually or automatically based on a program prepared in advance.

Figure 2:
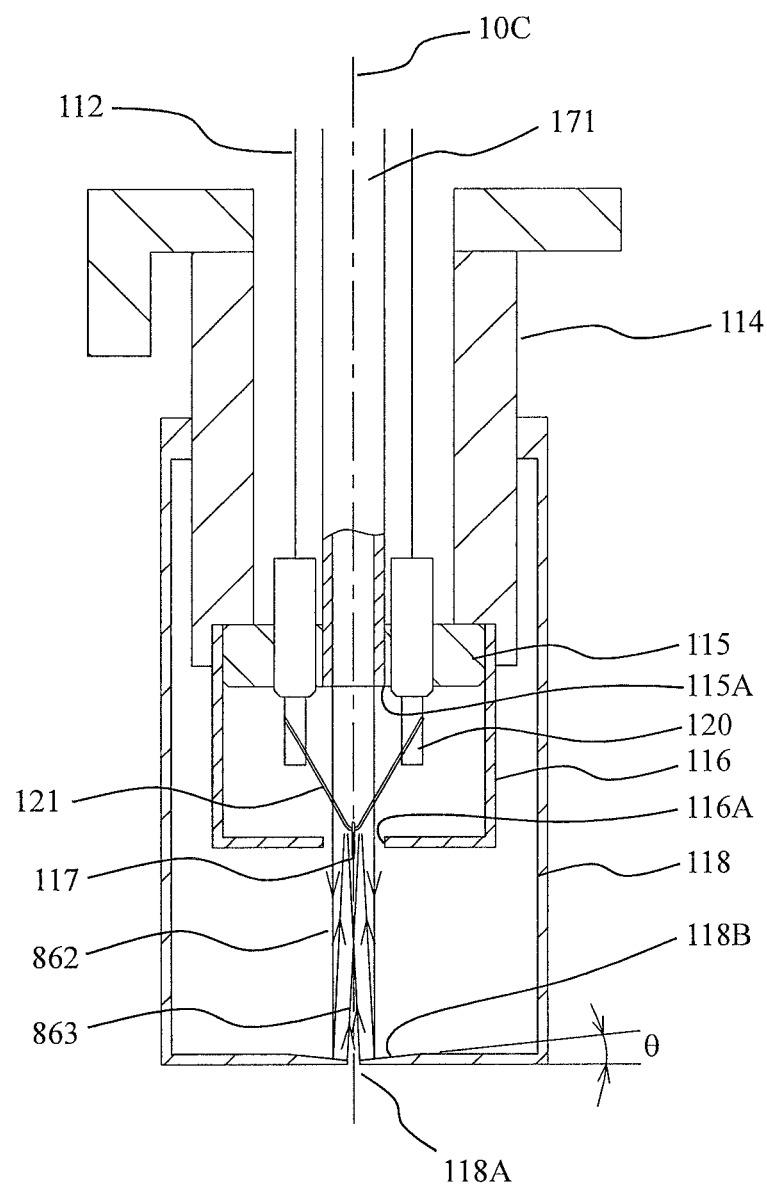
FIG. 2 is a view illustrating an exemplary structure of the periphery of a tip of a charged particle emission gun of the charged particle beam apparatus of the present invention.

The structure of the primary part of the charged particle emission gun of the present invention will be described with reference to FIG. 2. The charged particle emission gun of the present example includes the cylindrical holder 114, the disk-shaped insulator 115 of the tip attached to the bottom end thereof, two electrodes 120 supported by the insulator 115 of the tip, a tungsten hairpin filament 121 welded to the electrodes, and the tip 117 welded to the end of the hairpin filament 121. A high voltage is applied to the tip 117 via the electrical wire 112. The charged particle emission gun of the present example further includes an ion collector 116 that is made of metal and is connected to the outer circumference of the insulator 115 of the tip, and an extracting electrode 118 attached to the outer circumferential surface of the holder 114.

In the charged particle emission gun of the present example, the holder 114, the insulator 115 of the tip, the two electrodes 120, the tungsten hairpin filament 121, the tip 117, and the extracting electrode 118 form a tip unit. In the charged particle emission gun of the present example, the tip unit is assembled such that the central axis line of the tip 117 coincides with the central axis line of the disk-shaped insulator 115 of the tip. That is, in the assembling of the tip unit, the tip 117 and the insulator 115 of the tip having the filament 121 attached thereto are concentrically fitted into the holder 114 so that the two central axis lines are aligned.

In the charged particle emission gun of the present example, the optical fiber 171 is arranged along the central axis line 10C of the vacuum chamber 10. The optical fiber 171 has a metal cap attached to an end thereof. The insulator 115 of the tip has a hole 115A formed in the center thereof. The metal cap of the end of the optical fiber 171 engages with the hole 115A. When the metal cap is attached to the end of the optical fiber 171, the optical fiber 171 can be fixed in a state in which the optical axis of the optical fiber 171 is aligned with the central axis line 10C of the vacuum chamber 10. As the tip 117 and the optical fiber 171 are coaxially arranged in this manner, the components that form the tip unit are symmetrical about the central axis line 10C. Therefore, there is no possibility that the axes of the components that form the tip unit would deviate even at an ultralow temperature.

Due to thermal expansion or thermal shrinkage, not only displacement in the Z-axis direction but also displacement in two directions (referred to as an X-axis and a Y-axis) that are orthogonal to the Z-axis occur. However, as the displacement in the X-axis and the displacement in the Y-axis coaxially occur, no deviations of the axes would occur. Even if displacement in the Z-axis direction occurs, there will be no influence on the irradiation optical system for the cleaning irradiation light from the optical fiber 171.

The ion collector 116 has a hole 116A formed in the bottom face thereof. The extracting electrode 118 has a hole 118A formed in the bottom face thereof. A circumferential tapered surface 118B is formed around the hole 118A. Provided that the inner diameter ø of the hole 118A in the bottom face of the extracting electrode 118 is 0.5 mm and the distance between the tip 117 and the hole 118A of the extracting electrode 118 is 10 mm, the angle θ made between the tapered surface 118B and the horizontal plane is 2°. Note that the outer diameter ø of the tip 117 is about 0.1 mm.

The optical fiber 171, the tip 117, the hole 116A of the ion collector 116, and the hole 118A of the extracting electrode 118 are coaxially arranged. That is, they are arranged along the central axis line 10C of the vacuum chamber 10. Therefore, cleaning irradiation light 862 emitted from the end of the optical fiber 171 first irradiates the tip 117 from its rear side, and is further reflected by the tapered surface 118B. The reflected light 863 irradiates the tip 117 from below the tip 117.

In order to obtain the reflected light 863, the diameter of the light beam of the cleaning irradiation light 862 emitted from the end of the optical fiber 171 should be greater than the diameter (about 0.5 mm) of the hole 118A of the extracting electrode 118. According to the present example, the end of the tip 117 can be irradiated with the light beam of the cleaning irradiation light 862 emitted from the end of the optical fiber 171 without convergence. In addition, the tip 117 can also be irradiated with the reflected light 863 with a greater spot diameter than the outer diameter (about 0.1 mm) of the tip 117 and with the light intensity being substantially maintained.

In particular, when the irradiation light from the cleaning photo-irradiation apparatus 170 is a laser ray, the directionality is high. Thus, the beam diameter of the cleaning irradiation light 862 emitted from the end of the optical fiber 171 is substantially identical to the inner diameter of the optical fiber 171. In addition, the beam diameter of the reflected light from the tapered surface 118B is also substantially identical to the inner diameter of the optical fiber 171. Therefore, the end of the tip 117 is surely irradiated with the irradiation light from all directions.

The holder 114 and the insulator 115 of the tip are formed of insulating materials. As the holder 114 and the insulator 115 of the tip are cooled to an ultralow temperature, ceramics with high thermal conductivity, specifically, aluminum nitride or sapphire is used.

The extracting electrode 118 may be formed of a single member, but may also be formed of a combined structure of a disc and a cylinder. When the extracting electrode 118 is formed of a single member, the extracting electrode 118 may be formed using aluminum, and the surface or the tapered surface 118B thereof may be formed as a mirror surface. Further, the surface or the tapered surface 118B of the extracting electrode 118 may be coated by vapor deposition, plating, or ion plating. The coating material may be aluminum, but a noble metal such as gold (Au), silver (Ag), or platinum (Pt) may also be used. Such noble metals have lower reflectance than aluminum. However, as $H_2$ is physically adsorbed onto a noble metal at an ultralow temperature, the adsorbed $H_2$ will easily undergo photon stimulated desorption.

In an example that the inventor of the present application has conducted, when the tapered surface 118B of the extracting electrode 118 was plated with gold (Au), the reflectance thereof decreased to 30 to 40%. However, the decrease in the reflectance was able to be compensated by adjusting the intensity of the infrared light or the ultraviolet light that is the cleaning irradiation light.

When the extracting electrode 118 is formed of a combined structure of a disc and a cylinder, the disc, which is the primary part of the extracting electrode 118, may be formed of oxygen-free copper. In this case, a hole is formed in the disc and the tapered surface 118B is formed around the hole. The tapered surface 118B may be formed by vapor-depositing aluminum after polishing the base material of oxygen-free copper. Accordingly, a reflectance of 90% or greater can be obtained. Note that the tapered surface 118B may also be coated with a noble metal. As described above, $H_2$ is physically adsorbed onto a noble metal at an ultralow temperature. Thus, the adsorbed $H_2$ will easily undergo photon stimulated desorption. The material of the tip 117 will be described later with reference to FIGS. 5A and 5B.

Figure 3:
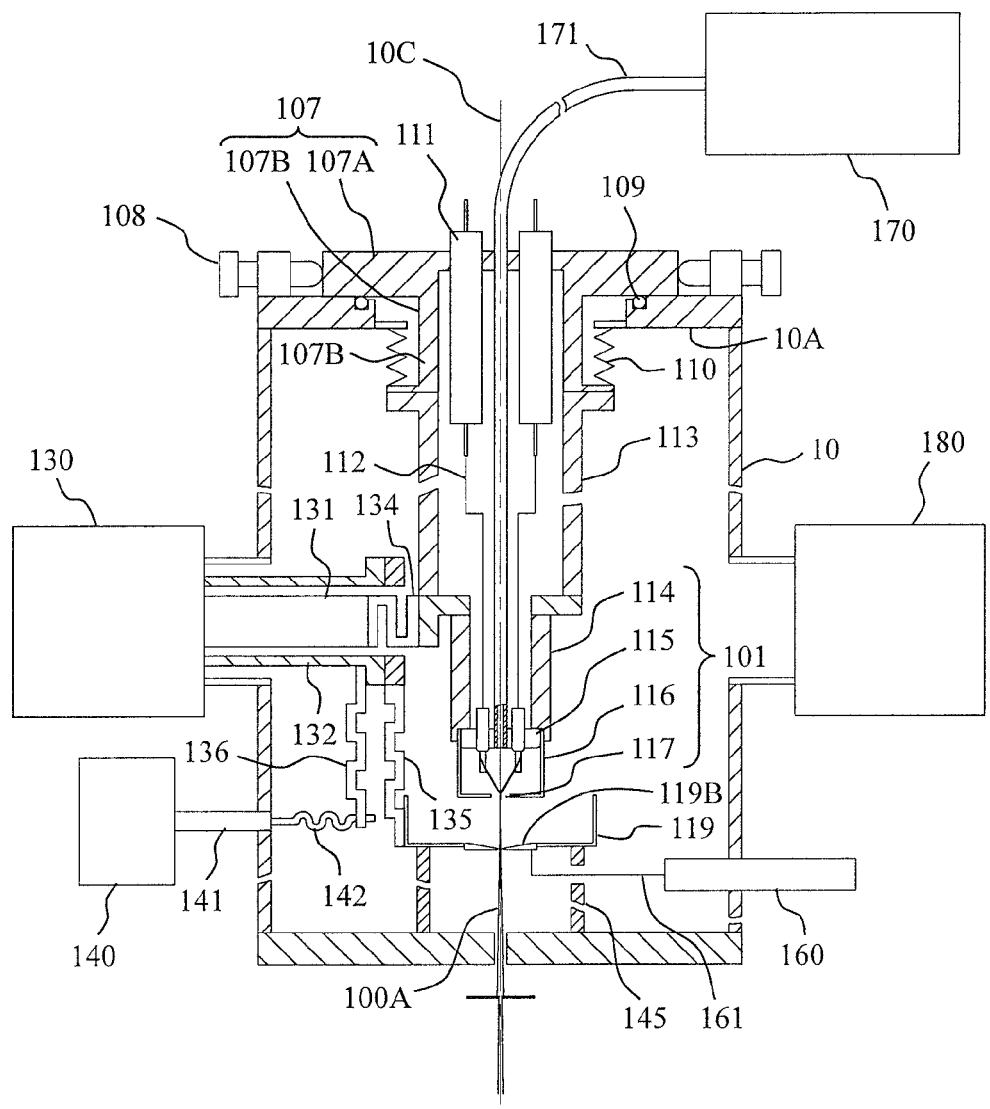
FIG. 3 is a view illustrating the cross-sectional structure of a primary part of a second example of the charged particle beam apparatus of the present invention.

A second example of the charged particle beam apparatus in accordance with the present invention will be described with reference to FIG. 3. Herein, the primary part of the charged particle beam apparatus, in particular, a portion of the charged particle emission gun will be described in detail. The structure of the charged particle beam apparatus of the present example is basically the same as that of the first example in FIG. 1, but differs from that of the first example in that the extracting electrode is separated from the tip unit. This is preferable when there is a request for some performance of the optical system of the charged particle emission gun or a request for electrical insulation performance of the extracting electrode against the tip so that the extracting electrode can be used at a higher voltage than that in the first embodiment.

The support structure 107 is provided on the ceiling 10A of the vacuum chamber 10. The holder 114 is attached to the bottom end of the cylindrical portion 107B of the support structure 107 with the thermal insulation structure 113 interposed therebetween. The holder 114 has mounted thereon the insulator 115 of the tip and the ion collector 116 made of metal. The tip 117 is attached to the insulator 115 of the tip. In the present example, the holder 114, the insulator 115 of the tip, the tip 117, and the ion collector 116 form a tip unit 101. The tip unit 101 of the present example does not include an extracting electrode. The thermal insulation structure 113 and the tip unit 101 are supported in a state in which they are hung on the support structure 107.

An extracting electrode 119 is supported by a thermal and electrical insulation structure 145 attached to the bottom wall of the vacuum chamber 10. The thermal and electrical insulation structure 145 is cylindrical in shape, and the inside thereof may be provided with an optical system of the charged particle emission gun. Note that the optical system of the charged particle emission gun includes an electrostatic lens, an electromagnetic lens, or the like for converging the charged particle beam 100A, and the optical axis thereof is aligned with the central axis line 10C of the vacuum chamber 10.

The extracting electrode 119 may be formed of a single member, but may also be formed of a combined structure of a disc and a cylinder. Herein, description will be made on the assumption that the extracting electrode 119 is formed of a combined structure of a disc and a cylinder. The extracting electrode 119 has a circular metal electrode and a cylindrical member that supports the electrode. The metal electrode has a hole in the center thereof, and a circumferential tapered surface 119B is formed around the hole. The support member is formed of an electrical insulation material. The optical fiber 171, the tip 117, the ion collector 116, and the extracting electrode 119 are coaxially arranged. That is, they are arranged along the central axis line 10C of the vacuum chamber 10.

An insulated feedthrough 160 of high voltage is mounted on the vacuum chamber 10. An electrical wire 161 connected to the control unit 303 for power supply (see FIG. 1) is introduced into the vacuum chamber 10 via the insulated feedthrough 160 of high voltage, and an end thereof is connected to the metal electrode of the extracting electrode 119. A desired high voltage is applied to the metal electrode via the electrical wire 161.

The gas supply apparatus 140 is mounted on the vacuum chamber 10. The gas supply pipe 141 outside the vacuum chamber 10 and a gas supply pipe 142 inside the vacuum chamber 10 are connected to the gas supply apparatus 140.

The cooling mechanism of the charged particle emission gun of the present example will be described. The cooling apparatus 130 includes a main body portion and cold ends 131 and 132. In the present example, two cold ends 131 and 132 are provided. The main body portion of the cooling apparatus 130 is arranged outside the vacuum chamber 10, and the cold ends 131 and 132 are arranged inside the vacuum chamber 10. The inner first cold end 131 is intended for low temperatures, and the outer second cold end 132 is intended for high temperatures. The second cold end 132 is formed such that it covers the first cold end 131, and has the function of a thermal shield for reducing heat radiation to the first cold end 131.

The first cold end 131 is provided to cool the tip 117. The inner end of the first cold end 131 is connected to the holder 114 via the net wire 134.

The inner end of the second cold end 132 is connected to the extracting electrode 119 via a net wire 135. In the present example, the extracting electrode 119 is not connected to the holder 114. Instead, the extracting electrode 119 is connected to the second cold end 132. Thus, the extracting electrode 119 is directly cooled by the second cold end 132. In the present example, the extracting electrode 119 is formed near the tip 117, as a face that is opposite to the tip 117. Therefore, the extracting electrode 119 is cooled with a view to reduce heat radiation to the tip 117. The metal electrode of the extracting electrode 119 is circular in shape that has a hole in the center thereof, and the thermal and electrical insulation structure 145 is cylindrical in shape; thus, no deviations of the axes would occur even when thermal shrinkage occurs due to cooling.

Further, the inner end of the second cold end 132 is connected to the gas supply pipe 142 inside the vacuum chamber 10 via a net wire 136. The gas supply pipe 142 is formed with a length that is necessary for thermal insulation, and with a sufficiently small cross section of the heat transmission path. In the present example, the gas supply pipe 142 is cooled. Thus, gas at about room temperature supplied from the gas supply apparatus 140 can be supplied after being cooled to a low temperature. Therefore, it is possible to prevent gas at about room temperature from directly colliding with the tip 117 or other members at an ultralow temperature, which would otherwise produce a thermal load. For the net wires 134, 135, and 136, materials with high thermal conductivity, for example, oxygen-free copper, copper net wires, or graphite sheets may be used.

The cooling apparatus 130 in the present example may be a commercially available two-stage refrigerator. It is acceptable as long as a refrigerator is used that can set both the refrigerant gas temperature of the low-temperature-side cold end 131 and the refrigerant gas temperature of the high-temperature-side cold end 132. In the cooling apparatus 130 of the present example, the second cold end 132 as a thermal shield is provided. Thus, it is possible to reduce thermal load on the first cold end 131 intended for low temperatures. Therefore, the temperature of the first cold end 131 can be further reduced. Note that it is acceptable as long as the low-temperature-side stage of the refrigerator in the present example has a refrigerating capacity of about 2 W at 20 K.

According to the cooling apparatus 130 of the present example, the temperature of the tip 117 can be set to an ultralow temperature of about 20 K, whereby a reduction in the energy width and an increase in the brightness of the charged particle beam become possible.

In the charged particle emission gun of the present example, the central axis line of the tip unit 101, that is, the central axis line of the tip 117 can be aligned with the central axis line 10C of the vacuum chamber 10 by the movement mechanism of the tip 117 provided to the support structure 107. Thus, it is possible to cause cleaning irradiation light to be reflected by the metal electrode of the extracting electrode 119 even at an ultralow temperature so that the reflected light irradiates the end of the tip 117. Note that the cooling apparatus 130 shown in FIG. 3 may also be used for the charged particle emission gun in FIG. 1.

Figure 4:
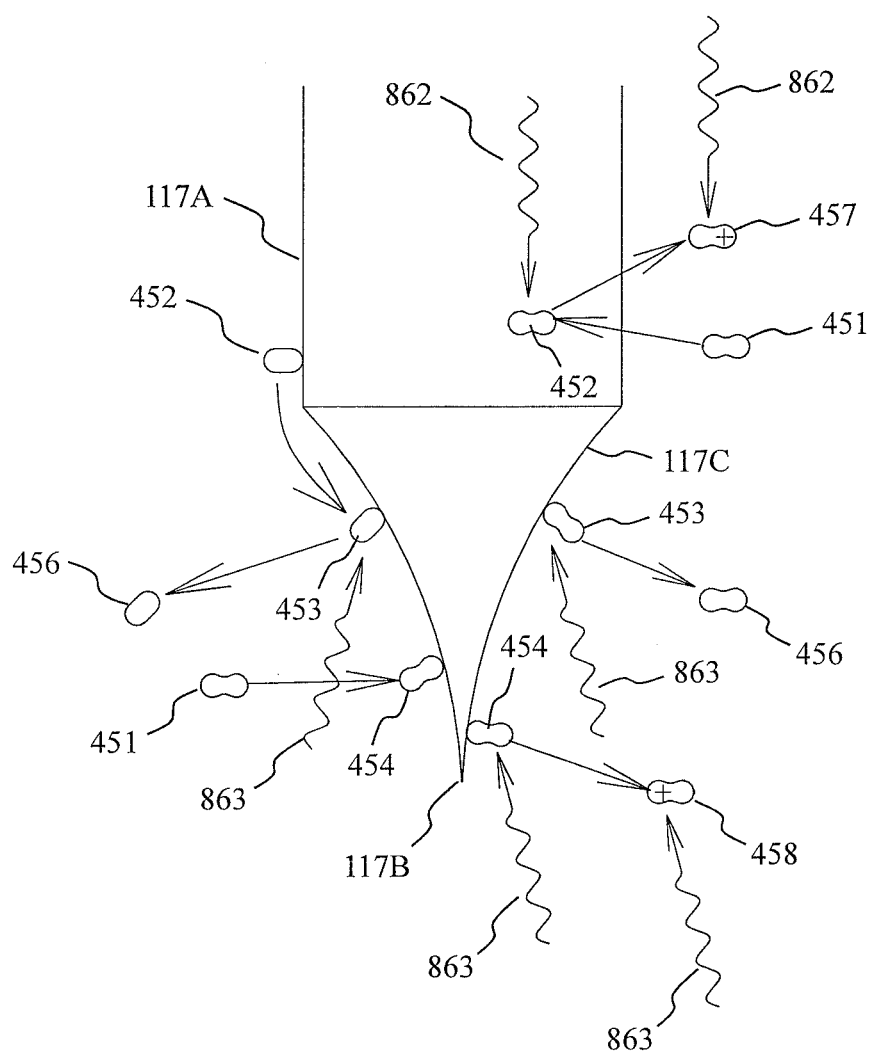
FIG. 4 is a schematic view illustrating a process of adsorption of the residual gas molecules onto the tip of the charged particle emission gun of the charged particle beam apparatus of the present invention, photon stimulated desorption of the adsorbed molecules, and ionization of the desorbed molecules.

Contamination and cleaning of the tip will be described with reference to FIG. 4. FIG. 4 illustrates an enlarged view of the end portion of the tip 117. A shank 117A of the tip is originally cylindrical in shape, but has a needle-shaped end portion 117C formed by etching through electrolytic polishing. In the present example, a apex 117B of the end portion 117C of the tip is made of a single atom. The atom arrangement at the apex 117B will be described later.

In a vacuum atmosphere in the vacuum chamber 10, the residual gas molecules 451 are inevitably present. The main gas molecules to be removed in the ultrahigh vacuum atmosphere of the vacuum chamber 10 are hydrogen ($H_2$) and carbon monoxide (CO). Some of the residual gas molecules 451 are adsorbed onto the tip with predetermined probability while traveling in the vacuum in a long time. In the present example, the tip is cooled to an ultralow temperature. Thus, the adsorbed gas is easily trapped by the tip. In this manner, adsorbed molecules 452, 453, and 454 stick to the shank 117A, the end portion 117C, and the apex 117B of the tip, respectively. Some of the adsorbed molecules 452 adsorbed on the shank 117A of the tip also move to the end portion 117C upon receiving some stimulus after the adsorption. When the tip is contaminated with the adsorbed molecules 452, 453, and 454 in this manner, a noise increase in the emitted current and a decrease in the amount of current with time would occur. Therefore, it is necessary to remove the molecules 452, 453, and 454 adsorbed on the tip.

According to the present invention, the shank 117A and the end portion 117C of the tip are irradiated with the cleaning irradiation light 862 from the cleaning photo-irradiation apparatus 170. For the irradiation light 862, ultraviolet light or infrared light in a predetermined wavelength region is used. The tip is irradiated with the irradiation light 862 from the rear side thereof as well as the reflected light 863 reflected by the extracting electrode 118 or 119.

When the adsorbed molecules 452, 453, and 454 on the shank 117A and the end portion 117C of the tip absorb the irradiation light 862 or the reflected light 863, the bonds between the adsorbed molecules and the atoms that form the tip are broken. Thus, the adsorbed molecules 453 become desorbed molecules 456 through photon stimulated desorption.

The desorbed molecules 456 should be removed promptly. If the desorbed molecules are present, it would be difficult to maintain the ultrahigh vacuum in the vacuum chamber. In addition, it will take time to return the atmosphere in the vacuum chamber to an ultrahigh vacuum again. Further, there is a possibility that the desorbed gas molecules may be adsorbed onto the tip again while floating in the vacuum.

According to the present invention, the desorbed molecules 456 are caused to be trapped by a member around the tip at an ultralow temperature, using a similar function to that of a cryogenic pump, or the desorbed molecules 456 are exhausted by the vacuum pump 180. Further, according to the present invention, the adsorbed molecules 452 and 454 may be caused to be desorbed, and then ionized by the irradiation light 862 or the reflected light 863. Ions 457 and 458 are removed by being absorbed by the ion collector 116. Note that ionization of the desorbed molecules may be conducted by resonance enhanced multi photon ionization (REMPI) or non-resonant multi photon ionization (NRMPI). This will be described later. The function of the ion collector 116 will be described with reference to FIGS. 7A and 7B.

Next, a light source of irradiation light for cleaning the tip will be described. For photon stimulated desorption of the adsorbed molecules, infrared light with a predetermined wavelength and intensity can be used. As a light source of the infrared light, an infrared lamp or an infrared laser source can be used. For example, an infrared laser source that generates infrared light with a peak output on the order of $MW/cm^2$ and a wavelength of 1 µm or greater may be used. By the infrared irradiation, vibration in the molecules adsorbed on the tip or vibration related to the bonds between the tip surface and the adsorbed molecules can be excited. The infrared light has a longer wavelength than the ultraviolet light. Thus, the materials for the optical system are not greatly limited. Therefore, it is possible to select the wavelength and the light intensity that are suitable for the desorption and dissociation of $H_2$ and CO.

For photon stimulated desorption of the adsorbed molecules, ultraviolet light with a predetermined wavelength and intensity can be used. As a light source of the ultraviolet light, a commercially available vacuum ultraviolet lamp is the simplest and is available at a low cost. As the vacuum ultraviolet lamp, a deuterium lamp may be used. A deuterium lamp generates intense ultraviolet light with a wavelength of 120 to 160 nm, and can easily obtain an intensity of several ten $\mu W/cm^2$ to several $mW/cm^2$. Thus, when the tip is continuously irradiated by a deuterium lamp, $H_2$ and CO can be caused to be desorbed from the tip. However, irradiation light of the vacuum ultraviolet lamp has low directionality. Therefore, it is predicted that the intensity of the light that irradiates the end of the tip will decrease, and thus a relatively long photo-irradiation time will be needed. Thus, using a laser source as an ultraviolet source is preferable.

$H_2$ and CO can be subjected to photon stimulated desorption by an ArF laser. For example, it is known that $H_2$ can be subjected to photon stimulated desorption by an ArF excimer laser of several ten $\mu J/cm^2$ and with a wavelength of 193 nm (6.4 eV), and CO can be desorbed even when an ArF excimer laser on the order of several $mJ/cm^2$ and with an energy of 6.4 eV or less is used. Thus, sufficient photon stimulated desorption can be caused to occur even when ultraviolet light of about 200 nm is used. For example, an ArF laser (193 nm) or a KrF laser (248 nm) can be used. In this manner, molecules that have undergone photon stimulated desorption can be removed by being exhausted by the vacuum pump or being trapped by a cooled member as described above.

For ionization of the desorbed molecules, an ultraviolet laser source can be used. The ionization energies of $H_2$ and CO are known to be about 15.4 eV and 14.0 eV, respectively. In order to directly ionize such molecules through a single-photon process, vacuum ultraviolet lights with wavelengths of 80.5 nm and 88.6 nm, which correspond to the respective ionization energies, is necessary. However, the ultraviolet lights with such short wavelengths is difficult to be obtained with a usual method for the reason that special materials are required for the optical system, for example.

Thus, according to the present invention, the desorbed molecules are ionized by resonance enhanced multi photon ionization (REMPI) or non-resonant multiphoton ionization (NRMPI). The REMPI is a method of selectively ionizing a rarefied gas in a vacuum with high efficiency. In the present example, the desorbed molecules are irradiated with ultraviolet light having a resonance absorption wavelength corresponding to the type of the gas, so that the desorbed molecules are selectively ionized. The NRMPI method is adapted to non-selectively ionize various types of desorbed molecules by irradiating the desorbed molecules with ultraviolet light having a non-resonance absorption wavelength.

When more positive cleaning is to be conducted by ionizing the desorbed molecules, in addition to the cleaning through photon stimulated desorption, it is necessary to use, as the light source of cleaning irradiation light, a light source that generates irradiation light for conducting photon stimulated desorption of the desorbed molecules, and a light source that generates irradiation light for ionizing the desorbed molecules. The light source of the cleaning irradiation light may be configured to switch among a plurality of laser sources that oscillate rays with different wavelengths, or switch between a lamp light source and at least one or more laser sources.

When the light source of the cleaning irradiation light is switched among laser rays with a plurality of wavelengths, or the wavelength is scanned, it is possible to remove the desorbed gas according to the wavelength. Thus, it is possible to not only cause photon stimulated desorption of the adsorbed molecules but also ionize the desorbed molecules through resonance enhanced multi photon ionization (REMPI) or non-resonant multiphoton ionization (NRMPI).

For example, it is possible to conduct photon stimulated desorption of the adsorbed molecules and ionization of the desorbed molecules using a wavelength tunable laser such as a dye laser (a wavelength of 380 to 1000 nm), a Ti:sapphire laser (670 to 1130 nm), or a Nd:YAG laser (1064 nm). When such a laser source is used, photon stimulated desorption of $H_2$ and CO is conducted using an infrared wavelength, and ionization of $H_2$ and CO is conducted using an ultraviolet wavelength. In order to generate an ultraviolet wavelength, a nonlinear optical phenomenon that uses a nonlinear optical crystal may be used.

For example, when the wavelength is switched between two wavelengths or the wavelength is scanned, it is possible to ionize $H_2$ and CO. Alternatively, it is also possible to use harmonics of a wavelength tunable laser and conduct resonance enhanced multi photon ionization (REMPI) of a three-photon absorption process using ultraviolet lights of around 201 nm and 230 nm that are the respective resonance absorption wavelengths.

As a laser ray from a laser source has directionality, it is possible to make the best use of the intensity of the ray reflected by the extracting electrode 118. Further, it is also possible to efficiently conduct photon stimulated desorption and vibration excitation between the adsorbed gas molecules and the tip surface according to the types of the adsorbed gas molecules.

When a charged particle emission gun is used as a gas field ionization ion source (GFIS), a noble gas of about 0.01 to 0.1 Pa is supplied to the periphery of the tip as a source gas. It is known that a noble gas on the order of $10^{-5}$ Pa is ionized at a laser light intensity on the order of $10^{14}$ $W/cm^2$. The number of the generated ions is proportional to the molecular density. Thus, when a source gas of about 0.1 Pa is supplied, there is a possibility that ions may be generated by intense ultraviolet light of about $10^{10}$ $W/cm^2$. Accordingly, it is necessary to avoid ionization in the gas phase in regions other than the region of the tip end. To this end, it is preferable to avoid using ultraviolet light with high intensity. Further, when ultraviolet light with high intensity is used, there occur problems of solarization of the optical path and ablation of the member irradiated with the light. When ablation or solarization occurs, there occur problems such as a decrease in the irradiation intensity with time, a decrease in the reflectance of the extracting electrode, contamination of the tip with the scattered metal, and a decrease in the electrical insulation properties.

In order to solve such problems, a laser ray with an ultrashort pulse width on the order of femtoseconds (which is less than or equal to several 100 femtoseconds) may be used. A technology of driving a laser ray with an ultrashort pulse width on the order of femtoseconds is a technology that has become commonly available in recent years as typified by a Q switch. This is a technology of obtaining a laser ray with high intensity (high photon density) by merging small laser outputs in a short time. For example, when a laser ray of 100 $mJ/cm^2$ or less and with a pulse width of femtoseconds is used, the ablation may be ignored.

When a commonly available laser source with an ultrashort pulse of 100 fs at an output of 1 $mJ/cm^2$ is used, a high peak intensity of $10^{10}$ $W/cm^2$ and a light intensity of about 30 μJ/pulse can be easily obtained. Thus, desorption of the adsorbed gas molecules and ionization through resonance enhanced multi photon ionization (REMPI) or non-resonant multiphoton ionization (NRMPI) can be conducted.

In addition, it is considered that as the resonance enhanced multi photon ionization (REMPI) that has been conventionally conducted on the order of nanoseconds is conducted on the order of femtoseconds with about the same light intensity, multiphoton absorption also occurs at the excitation level of shorter lifetime, resulting in improved ionization efficiency. At this light intensity, ablation does not occur, and thus the tip and other members are not damaged, and further, unwanted ionization in the noble gas does not occur, either.

Although a case where a charged particle emission gun is used as an ion gun has been described above, such a method can also be applied to a case where a charged particle emission gun is used as an electron gun.

When the wavelength and the output of a laser ray are adjusted, it also becomes possible to conduct photon stimulated desorption and ionization of the residual gas other than $H_2$ and CO. It is acceptable as long as a lamp light source or a laser source is selected taking into consideration the configuration of the applied charged particle emission gun and the cost performance.

According to the present invention, it is possible to remove unwanted adsorbed molecules without applying heat and without damaging the base material of the tip, using ultraviolet light or infrared light. Therefore, it is possible to obtain a high-brightness, coherent charged particle emission source.

Figure 5A:
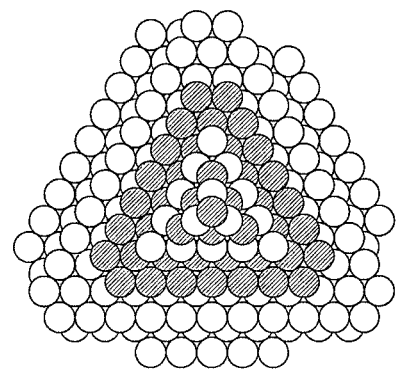
FIG. 5A is a view in which an exemplary atom arrangement of a nano-pyramid structure formed at the end of the tip of the charge particle emission gun is seen from the end side of the tip.
Figure 5B:
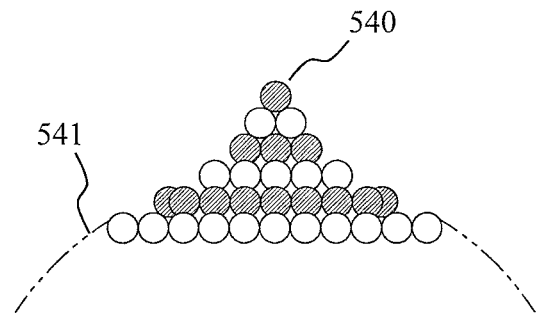
FIG. 5B is a view in which an exemplary atom arrangement of the nano-pyramid structure at the end of the tip of the charge particle emission gun is seen from the lateral side of the tip.

FIG. 5A is a view schematically illustrating an atom arrangement when the apex of the end portion of the tip is observed from the direction of the central axis line of the tip. FIG. 5B is a view schematically illustrating an atom arrangement observed when the apex of the end portion of the tip is observed from a side face of the tip. In the drawings, atoms are schematically shown by circles for understanding of the atom arrangement. In addition, hatching is shown every other atom layers. As shown in the drawings, the apex of the end portion of the tip has a nano-pyramid structure with a triangular pyramid, and the apex of the pyramid is made of a single atom 540. Thus, with the tip of the present example, a point light source in the real sense is formed. With such a single atom emission source, it is possible to obtain higher brightness than that with a typical charged particle emission source.

The apex of a tip of a typical charged particle emission source is formed by an atom arrangement plane of the fourth to fifth layer counted from the single atom 540 at the apex as shown in a contour 541 of a two-dot chain line. That is, the apex of a typical tip is formed by an atom arrangement excluding the apex portion of the nano-pyramid structure, and the curvature radius thereof is about several hundred to 1000 Å.

A tip with a nano-pyramid structure has a projecting shape such that an end thereof has a single atom to several atoms, and has been researched from long before as a method of microfabricating a probe of a scanning tunneling microscope (STM) or improving the brightness of an electron source. A tip is formed of a metal needle. As the base material of the tip, tungsten (W), molybdenum (Mo), iridium (Ir), rhenium (Re), or carbon (C), which is a high-melting-point metal, is used. In particular, in the case of an electron source, a carbon nanotube or diamond can be used as the base material of the tip. Such metal elements are stable against the removal of impurities or the formation of a strong electric field by instantaneous heating at a high temperature.

Further, the end portion of the tip may be coated with any one of gold (Au), silver (Ag), platinum (Pt), palladium (Pd), rhodium (Rh), iridium (Ir), ruthenium (Ru), or osmium (Os). Such a noble metal is also used for avoiding oxidation and as a material for forming a nano-pyramid. In particular, $H_2$ is known to be physically adsorbed onto a noble metal at an ultralow temperature. Therefore, when a noble metal is used, there is an advantage in that photon stimulated desorption of $H_2$ easily occurs.

For the charged particle emission gun of the present invention, a tip with a nano-pyramid structure containing only tungsten is preferably used. A method of fabricating a tip with a nano-pyramid structure containing only tungsten has been known.

Figure 5C:
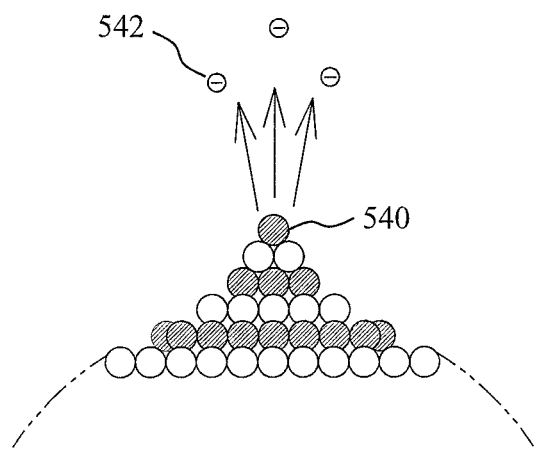
FIG. 5C is a view illustrating a state in which, when a charged particle emission gun is used as a cold cathode field emission source, tunneling electrons are emitted from a single atom at the apex of the nano-pyramid at the end of the tip.

A case where a single atom emission source is used as a cold cathode field emission source will be described with reference to FIG. 5C. In this case, tunneling electrons 542 are emitted only from a single atom 540 at the apex with the strongest electric field. Therefore, an electron beam with high directionality, uniform energy, and high brightness can be emitted.

Figure 5D:
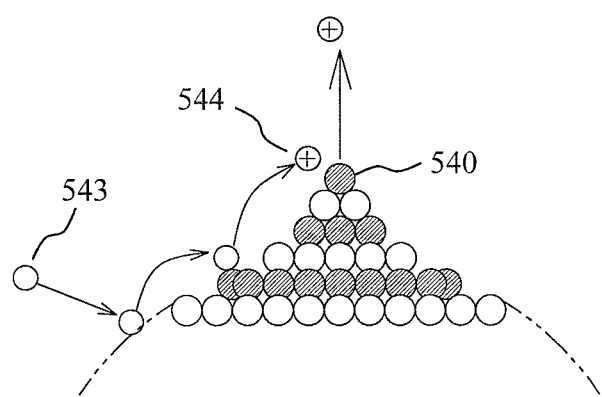
FIG. 5D is a view illustrating a state in which, when a charged particle emission gun is used as a gas field ionization ion source (GFIS), a source gas hops at the nano-pyramid at the end of the tip, and undergoes field ionization at the single atom at the apex.

A case where a single atom emission source is used as a gas field ionization ion source (GFIS) will be described with reference to FIG. 5D. In this case, a source gas 543 collides with the surface of the tip at an ultralow temperature, and hops while losing energy, and then undergoes field ionization on the single atom 540 at the apex with the strongest electric field. An ion 544 of the source gas is extracted from the single atom 540 at the apex. In this manner, a charged particle beam with high brightness can be emitted.

Figure 6A:
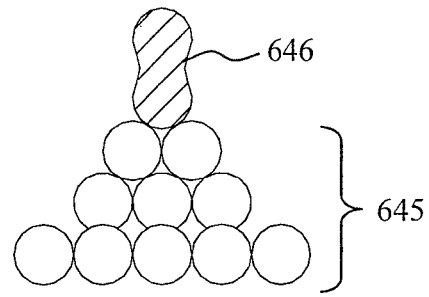
FIG. 6A is a schematic view illustrating a case where a two-atom molecule is adsorbed on the apex of the nano-pyramid structure at the end of the tip.

A case where the adsorbed molecule sticks to the periphery of the apex of the nano-pyramid structure will be described with reference to FIGS. 6A, 6B, and 6C. As shown in FIG. 6A, in the case of a charged particle emission source with a nano-pyramid structure, there is a possibility that a dissimilar adsorbed molecule 646 may be arranged at the apex of the nano-pyramid structure. In such a case, emission of charged particles becomes unstable. In particular, in a gas field ionization ion source (GFIS), a bond with the base becomes weak due to the movement of electrons between the atoms 645 that form the nano-pyramid structure and the adsorbed molecule 646 or the polarization of the adsorbed molecule 646.

Figure 6B:
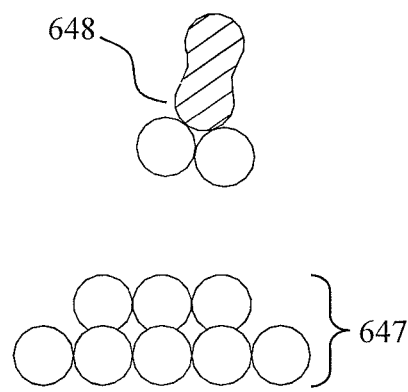
FIG. 6B is a schematic view illustrating the end of the nano-pyramid being broken as a result of a field evaporation voltage having decreased due to the influence of adsorption in the nano-pyramid structure at the end of the tip.
Figure 6C:
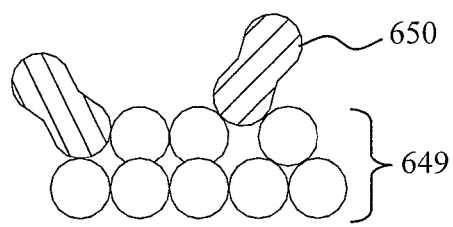
FIG. 6C is a schematic view illustrating the formation of a nano-pyramid being hindered by the adsorbed gas in the nano-pyramid structure at the end of the tip.

Then, as shown in FIG. 6B, the field evaporation voltage decreases due to the influence of the adsorption, and the end of the nano-pyramid is thus broken. There are also cases where the atoms 647 that form the nano-pyramid remain, but the nano-pyramid is broken as a result of field evaporation having occurred at an atom group 648.

A nano-pyramid structure is formed by moving atoms of a given base material on the tip surface or moving dissimilar atoms that have been applied by vapor deposition or plating. Thus, as shown in FIG. 6C, when an adsorbed molecule 650 is present on atoms 649 that form the end portion of the tip, movement (migration) of atoms for forming the apex is hindered or interrupted. Therefore, it is impossible to form an apex made of a single atom.

Figure 7A:
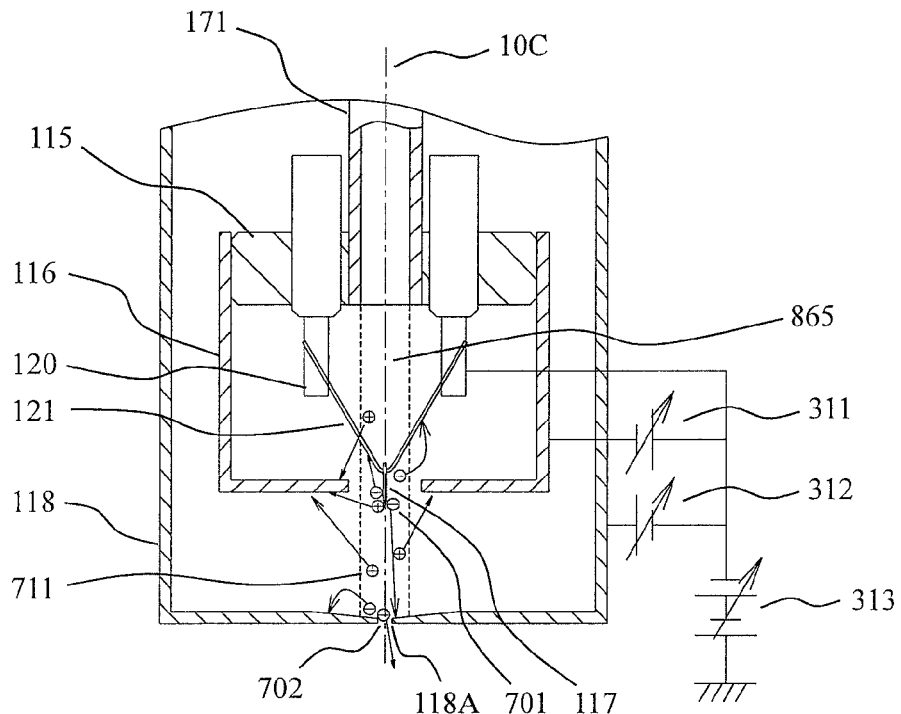
FIG. 7A is an explanatory view illustrating the operation of an ion collector when the charged particle emission gun of the present invention is used as an electron gun.

Description will be made with reference to FIG. 7A of high voltages applied to the tip 117, the ion collector 116, and the extracting electrode 118 as well as scattered electrons when the charged particle emission gun in accordance with the present invention is used as an electron gun. A high voltage power supply 313 is connected to the tip 117, and high voltage power supplies 311 and 312 are connected to the ion collector 116 and the extracting electrode 118, respectively. As described with reference to FIG. 1, the high voltage power supplies 311, 312, and 313 are formed by the control unit 303 for power supply.

In the case of an electron gun, the potential of the extracting electrode 118 is set at a higher (positive) potential than the potential of the tip 117. An electron beam from the tip 117 is extracted by the extracting electrode 118, and is guided to the vacuum chamber 11 for the optical system through the hole 118A of the extracting electrode 118.

For example, when ultraviolet light has a wavelength of 120 nm, the photon energy thereof is 10.3 eV that is a higher value than the usual energy (about 7 eV) for ionizing metals. Thus, photoelectrons are generated by the ultraviolet light. When the extracting electrode 118 is coated with aluminum with lower ionization energy (about 6 eV), photoelectrons are emitted in response to even ultraviolet light with a wavelength of 200 nm. Further, ions are generated by REMPI.

As shown in the drawings, when a member on the path is irradiated with ultraviolet light 865 from the optical fiber 171, there is a possibility that photoelectrons 701 (indicated by circles with "−" sign in the drawing) may be excited. The photoelectrons 701 are accelerated in the direction of the extracting electrode 118 that is at a higher (positive) potential than the tip. The photoelectrons 701 collide with molecules that have undergone photon stimulated desorption, and ionize the molecules. Accordingly, ions 711 (indicated by circles with "+" sign in the drawing) of the desorbed molecule are generated. Note that the ions 711 are also generated by resonance enhanced multi photon ionization (REMPI) or non-resonant multi photon ionization (NRMPI).

With the absence of the ion collector 116, the ions 711 are pulled toward the tip 117 at a negative potential. Consequently, the ions 711 collide with the tip 117 and thus break the end of the tip 117. In particular, breaking of the nano-pyramid structure is fatal. In the case of an electron gun, the ions 711 are trapped by the ion collector 116. Therefore, the potential of the ion collector 116 is set at a lower potential than the potential of the tip 117. That is, the extracting electrode potential>the tip potential>the ion collector potential.

Further, the photoelectrons 701 generated between the insulator 115 of the tip and the ion collector 116 are pushed back in the direction of the tip 117 or the hairpin filament 121 by an electric field of the ion collector 116, and then are absorbed. Thus, when a potential lower than the potential of the tip 117 is applied to the ion collector 116, it is possible to reduce photoelectrons 701 that contribute to the generation of the ions 711.

Some of the photoelectrons 701 pass through the hole 118A of the extracting electrode 118, and become electrons other than an electron beam used as a probe, that is, scattered electrons. When scattered electrons 702 enter the vacuum chamber 11 for the optical system via the hole 10D of the vacuum chamber 10 and thus irradiate a specimen, an information signal obtained from the specimen is generated, and noise is also generated on an image. However, if the valve 151 is closed, the scattered electrons 702 will not affect the vacuum chamber 11 for the optical system or the specimen. When the specimen is photosensitive to ultraviolet light like a resist, the valve 151 may be closed in a similar way. Accordingly, it is possible to avoid a circumstance that the ultraviolet light irradiates the specimen.

When the specimen 205 is not photosensitive to (does not suffer damage from) the ultraviolet light 865, the valve 151 need not be closed. In that case, the scattered electrons 702 are reduced by the aperture 202. Further, when the beam blanker 203 is operated, it is possible to deflect the scattered electrons 702 and thus prevent irradiation of the specimen 205 with the scattered electrons 702.

As described above, according to the present invention, cleaning of the tip through photo-irradiation is possible even when the electron gun is operating. However, if the tip is cleaned at all times while the electron gun is operating, it is also necessary to open/close the valve 151, operate the beam blanker 203, and the like at all times, which are not preferable. Thus, the tip is preferably cleaned periodically in predetermined cycles.

According to the Langmuir amount (1 Langmuir is the amount of adsorption of a single atom layer of the residual gas onto the surface in a second in a vacuum of $1.33 \times 10^{-4}$ Pa), which is an index of the adsorption amount in a vacuum, it takes 3.7 hours for a single atom layer to be adsorbed in a vacuum of $1 \times 10^{-8}$ Pa. Thus, the tip cleaning cycle may be set to a shorter time than every 3.7 hours. For example, the tip cleaning operation cycle may be set to every 3 hours. The tip cleaning cycle may be set to at least once a few hours.

Typically, the laser oscillation of an ultrashort pulse allows repeated emission of 10 Hz or more. Even when several ten times of emissions are needed, the time needed for the tip cleaning is only several seconds. Thus, the time needed for a single tip cleaning operation is about several seconds. Thus, in the tip cleaning operation, only a high voltage of the electronic gun may be temporarily stopped. Accordingly, generation of photoelectrons and scattered electrons can be minimized. Note that in this case, the valve 151 may be closed to avoid irradiation of the specimen 205 with scattered electrons and ultraviolet light as described above.

When the tip cleaning is conducted, even if the cleaning is executed while turning off the high voltage applied to the charged particle emission gun and closing the valve 151, the operating time of the device is not hindered to a great extent.

Cleaning cycles, ultraviolet light irradiation time and pulse width, on/off control of a high voltage, and the like are controlled by the control computer 301. Such parameters and schedules of the cleaning are stored in and executed by the control computer 301.

When a high voltage is turned off and turned on again, there are cases where a long time may be required to stabilize the output of the power supply. In such cases, it is necessary to promptly remove ions by executing cleaning with the voltages of the high voltage power supplies kept on.

Thus, voltages registered on the control computer 301 may be applied to the high voltage power supplies 311 to 313. Note that this method can be applied to a case where a lamp light source is used that includes ultraviolet light with an ultrashort wavelength having higher photon energy than the energy (about 7 eV or greater) for ionizing a metal member, a case where the extracting electrode 118 is coated with aluminum (about 6 eV) with lower ionization energy and capable of emitting photoelectrons in response to ultraviolet light with a wavelength of 200 nm, and a case where ions are generated by REMPI.

Figure 7B:
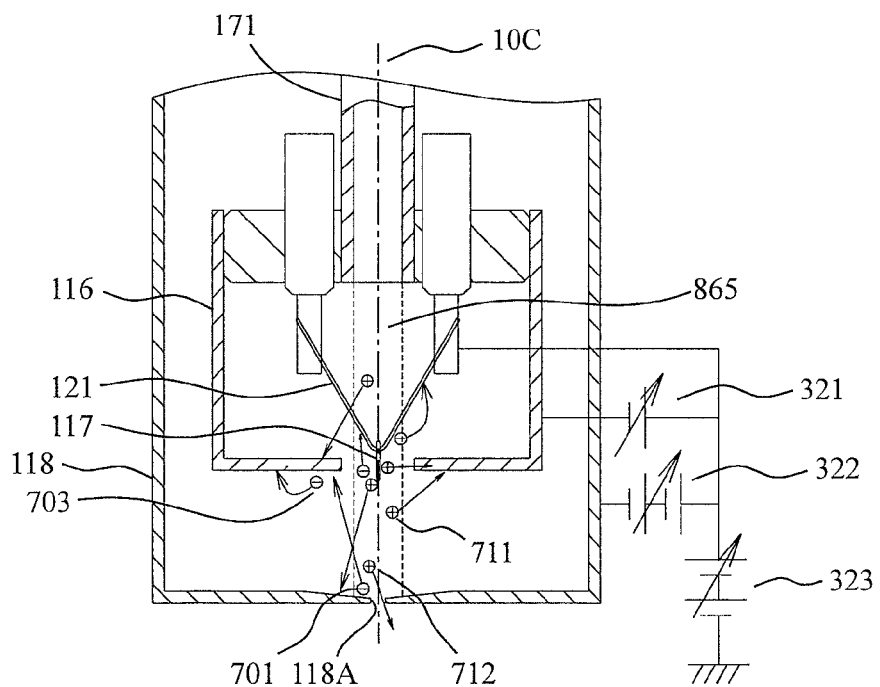
FIG. 7B is an explanatory view illustrating the operation of an ion collector when the charged particle emission gun of the present invention is used as an ion gun.

Description will be made with reference to FIG. 7B of high voltages applied to the tip 117, the ion collector 116, and the extracting electrode 118 as well as scattered ions when the charged particle emission gun in accordance with the present invention is used as an ion gun like a gas field ionization ion source (GFIS). A high voltage power supply 323 is connected to the tip 117, and high voltage power supplies 321 and 322 are connected to the ion collector 116 and the extracting electrode 118, respectively. In the case of the ion gun, the potential of the tip 117 is set at a higher (positive) potential than the potential of the extracting electrode 118. That is, the tip potential>the ion collector potential>the extracting electrode potential.

A source gas is ionized by a strong electric field generated at the end portion of the tip 117. Ions of the source gas are extracted by the extracting electrode 118, and are guided to the vacuum chamber 11 for the optical system through the hole 118A of the extracting electrode 118.

As with the electron gun, when a member on the path is irradiated with ultraviolet light 865 from the optical fiber 171, there is a possibility that photoelectrons 701 (indicated by circles with "−" sign in the drawing) may be excited. In the ion gun, the photoelectrons 701 are accelerated in the direction of the tip 117. The photoelectrons 701 collide with the adsorbed molecules that have undergone photon stimulated desorption, and ionize the molecules. Accordingly, ions 711 (indicated by circles with "+" sign in the drawing) of the desorbed molecules are generated. Note that the ions 711 are also generated by resonance enhanced multi photon ionization (REMPI) or non-resonant multi photon ionization (NRMPI). In addition, the ions 711 include those generated by the collision between the source gas and the photoelectrons 701.

In the ion gun, there is no possibility that the ions 711 (indicated by circles with "+" sign in the drawing) of the desorbed molecules will be pulled toward the tip 117. Thus, there is no possibility that the ions 711 of the desorbed molecules will collide with the tip 117 and will break the tip 117. In the ion gun, the ion collector 116 is set at a lower potential than the tip 117. The ions 711 of the desorbed molecules are pulled toward and trapped by the extracting electrode 118 at the lowest potential or the ion collector 116 at the second lowest potential.

As with the electron gun, the photoelectrons 701 generated between the insulator 115 of the tip and the ion collector 116 are pushed back in the direction of the tip 117 or the hairpin filament 121 by the electric field of the ion collector 116, and then are absorbed. Thus, when a potential lower than the potential of the tip 117 is applied to the ion collector 116, it is possible to reduce photoelectrons 701 that contribute to the generation of the ions 711. In addition, as the photoelectrons generated by the extracting electrode 118 collide with the ion collector 116, secondary electrons 703 are generated. Such secondary electrons 703 are absorbed by the tip 117 or the ion collector 116 and thus disappear.

Some of the ions 711 pass through the hole 118A of the extracting electrode 118 and become scattered ions 712. However, as with the electron gun, if the valve 151 is closed, the scattered ions 712 will not affect the vacuum chamber 11 for the optical system or the specimen. When the specimen is photosensitive to ultraviolet light, the valve 151 may be similarly closed. Accordingly, it is possible to prevent the specimen from being irradiated with the ultraviolet light.

When the specimen 205 is not photosensitive to (does not suffer damage from) the ultraviolet light 865, the valve 151 need not be closed. In that case, the scattered ions 712 are reduced by an aperture 202. Further, when the beam blanker 203 is operated, it is possible to deflect the scattered ions 712 and thus prevent the specimen 205 from being irradiated with the scattered ions 712.

In the gas field ionization ion source (GFIS), a method of conducting a small amount of evacuation while flowing a source gas, or a method of encapsulating a source gas in a region around the tip and not conducting evacuation is used. Thus, the amount of the generated ions is considered to be relatively larger than that in the case of the electron gun. Thus, in the gas field ionization ion source (GFIS), not only a photon stimulated desorption process but also an ionization process is particularly effective for cleaning the tip.

Ionization of the source gas has already been described. Ionization of an impurity gas contained in the source gas will be studied below. An impurity gas contained in the source gas is ionized with lower field intensity than that of a noble gas. Thus, when an electric field with high intensity is generated around the tip, the impurity gas cannot be adsorbed onto the tip. For example, suppose that the noble gas is helium and the impurity gas is hydrogen. The field intensity of ionization of helium is about 4.4 V/Å, and the field intensity of ionization of hydrogen is about 2.2 V/Å, which is a half the intensity of helium. Thus, there is no possibility that hydrogen will be adsorbed onto the tip.

However, when the field intensity of ionization around the tip is reduced to reduce the ion current, there is an increased possibility that the impurity gas may be adsorbed around the end of the tip. Further, when the ion gun is stopped, there is a problem in that adsorption of the impurity gas occurs, which could change the position of emission of an ion beam or lose the stability. Thus, according to the present invention, a tip cleaning operation is conducted without stopping the operation of the ion gun.

However, the tip is preferably not cleaned at all times while the ion gun is operating. This is the same as in the case of the electron gun. Thus, the tip is cleaned in predetermined cycles as with the electron gun.

When the tip cleaning is conducted, a negative voltage may be applied only to the ion collector, and the tip and the extracting electrode may be set at the ground potential. Alternatively, a positive voltage may be applied to the tip and the extracting electrode relative to the potential applied to the ion collector. It is also possible to emit a laser ray or a lamp ray at a given repetition frequency each time immediately before the ion gun in a non-operating condition is switched to an operating condition.

Figure 8:
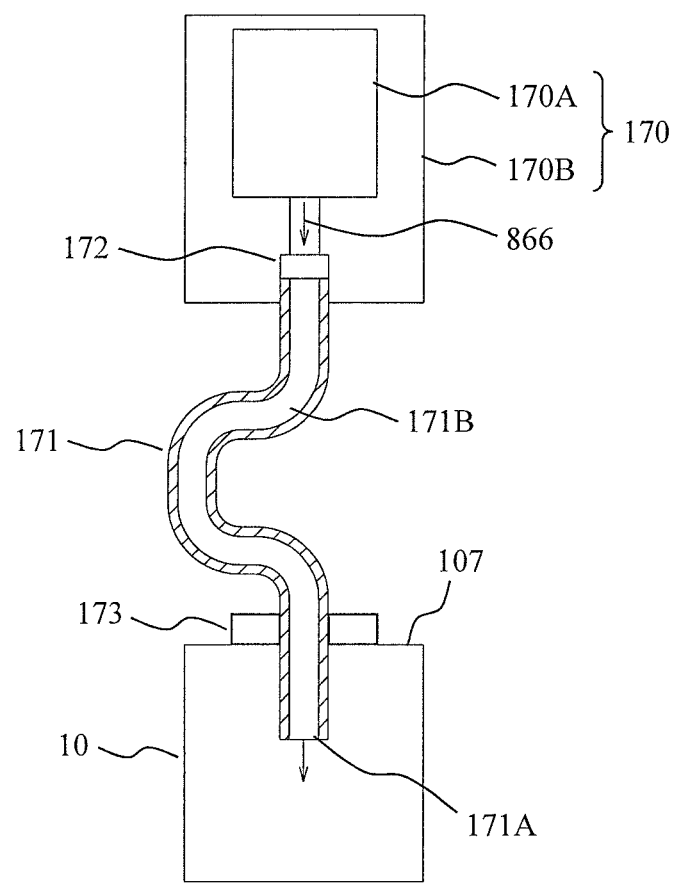
FIG. 8 is a view illustrating an example in which a hollow optical fiber is used to introduce infrared light or ultraviolet light to the end of the tip in the charged particle emission gun of the present invention.

The cleaning photo-irradiation apparatus 170 and the optical fiber 171 of the present example will be described with reference to FIG. 8. When a laser ray with high intensity is generated by a laser source, there occur problems of solarization of an optical path and ablation of the member irradiated with the ray. When ablation or solarization occurs, there occur problems such as a decrease in the irradiation intensity with time, a decrease in the reflectance of the extracting electrode, contamination of the tip with the scattered metal, and a decrease in the electrical insulation properties. Thus, the cleaning photo-irradiation apparatus 170 and the optical fiber 171 in the present example are configured to prevent generation of solarization.

The cleaning photo-irradiation apparatus 170 in the present example includes a sealed chamber 170B and a laser source 170A arranged therein. The sealed chamber 170B has encapsulated therein dried nitrogen to prevent attenuation of ultraviolet light. As the optical fiber 171, a commercially available optical fiber or optical fiber bundle made of quartz glass doped with hydrogen or fluorine may be used. In the present example, a hollow optical fiber 171, in particular, is used as the optical fiber 171. A case where an ultraviolet laser source is used as the laser source 170A will be described.

As shown in the drawing, an ultraviolet laser ray 866 from the ultraviolet laser source 170A is shaped by an appropriate lens unit (not shown), and is guided to the end portion of the hollow optical fiber 171 via an ultraviolet light entrance window 172 made of quartz glass or calcium fluoride. The ultraviolet light entrance window 172 is obtained by hermetically sealing the end portion of the hollow optical fiber 171 with calcium fluoride. Thus, a space 171B in the hollow optical fiber 171 is completely sealed against the inner space of the cleaning photo-irradiation apparatus 170.

A hole in the support structure 107 provided on the ceiling of the vacuum chamber 10 is provided with a vacuum flange 173. The hollow optical fiber 171 and the vacuum flange 173 are hermetically integrated, and the vacuum flange 173 is attached to the vacuum chamber 10 with a gasket seal such as a Conflat flange. The hollow optical fiber 171 has an optical fiber output port 171A formed at the lower end thereof. The optical fiber output port 171A opens to the vacuum atmosphere in the vacuum chamber 10 via the insulator 115 of the tip. Thus, a space 171B in the hollow optical fiber 171 is connected to the inner space of the vacuum chamber 10. That is, the inner space of the hollow optical fiber 171 is retained in a high vacuum as with the inner space of the vacuum chamber 10. Thus, it is possible to minimize the attenuation of the ultraviolet light propagating through the hollow optical fiber 171. As described above, generation of solarization can be prevented in the present example.

According to the present invention, it is possible to retain a tip, which is used as a charged particle emission source, at an ultralow temperature and effectively clean the tip in a short time without applying heat. Thus, it is possible to minimize the time in which the charged particle emission gun stops operation, and use a stable charged particle beam probe with a narrow energy width and high brightness and without fluctuation and noise.

Further, the present invention can provide a charged particle beam apparatus with high energy resolution and a spatially small probe size, such as a high-resolution electron microscope or ion microscope, a lithographic apparatus that uses charged particles, or a spectrometer.

Further, when a charged particle emission source at an ultralow temperature is provided with cleaning means, it becomes possible to use a cold cathode field emission source or a gas field ionization ion source (GFIS), which has conventionally required a vacuum pressure of lower than or equal to an ultrahigh vacuum, in a vacuum pressure that is higher than the ultrahigh vacuum.

Consequently, baking of the charged particle emission gun that is necessary to realize an ultrahigh vacuum becomes unnecessary, and thus, the charged particle emission gun can be used in a short time even when the inside thereof is exposed to the atmosphere. Therefore, downtime of the charged particle beam apparatus can be minimized.

Although the examples of the present invention have been described above, it is to be easily understood by those skilled in the art that the present invention is not limited to the aforementioned examples, and various modifications are possible within the scope of the claims.

REFERENCE SIGNS LIST

10 Vacuum chamber
10A Ceiling
10B Hole
10C Central axis line
10D Hole
11 Vacuum chamber for optical system
12 Specimen chamber
100 Tip unit
100A Charged particle beam
101 Tip unit
107 Support structure
107A Flange portion
107B Cylindrical portion
107C Hole
108 Screw for moving tip
109 Sealing member
110 Bellows
111 Insulated feedthrough of high voltage
112 Electrical Wire
113 Thermal insulation structure
114 Holder
115 Insulator of tip
115A Hole
116 Ion collector
116A Hole
117 Tip
117A Shank
117B Apex
117C End portion
118 Extracting electrode
118A Hole
118B Tapered surface
119 Extracting electrode
119B Tapered surface
120 Electrode
121 Hairpin filament
130 Cooling apparatus
131,132 Cold end
134,135,136 Net wire
140 Gas supply apparatus
141,142 Gas supply pipe
145 Thermal and electrical insulation structure
150 Valve driving apparatus
151 Valve
160 Insulated feedthrough of high voltage
161 Electrical wire
170 Cleaning photo-irradiation apparatus
170A Laser source
170B Sealed chamber
171 Optical fiber
171A Optical fiber output port
171B Space
172 Ultraviolet light entrance window
173 Vacuum flange
180,181 Vacuum pump
201 Optical system
202 Aperture
203 Beam blanker
204 Optical system
205 Specimen
206 Specimen stage
301 Control computer 302 Display device
303 Control unit for power supply
311,312,313 High voltage power supply
321,322,323 High voltage power supply
451 Residual gas molecule
452,453,454 Adsorbed molecule
457,458 Ion
456 Desorbed molecule
540 Single atom
541 Contour
542 Tunneling electron
544 Ion
645 Atoms
646 Adsorbed molecule
647 Atoms that form Nano-pyramid
648 Atom group
649 Atoms
650 Adsorbed molecule
701 Photoelectron
702 Scattered electron
703 Secondary electron
711 Ion
712 Scattered ion
862 Irradiation light
863 Reflected light
865 Ultraviolet light
866 Ultraviolet laser ray

The invention claimed is:

1. A charged particle emission gun comprising:
a tip;
an extracting electrode having a central hole that is coaxial with the tip;
an ion collector arranged between the tip and the extracting electrode, the ion collector having a central hole that is coaxial with the tip;
a vacuum chamber that accommodates therein the tip, the extracting electrode, and the ion collector;
a cooling apparatus for cooling the tip; and
a cleaning photo-irradiation apparatus that generates ultraviolet light or infrared light to irradiate the tip.

2. The charged particle emission gun according to claim 1, wherein the cleaning photo-irradiation apparatus has an infrared laser source that generates an infrared laser ray with a peak output on the order of $MW/cm^2$ and a wavelength of 1 μm or greater.

3. The charged particle emission gun according to claim 1, wherein the cleaning photo-irradiation apparatus has an ultraviolet lamp that generates ultraviolet light with a continuous spectrum of a wavelength of 400 nm or less.

4. The charged particle emission gun according to claim 1, wherein the cleaning photo-irradiation apparatus has an ultraviolet laser source that generates an ultraviolet laser ray with a pulse width on the order of femtoseconds and a wavelength of 400 nm or less at an output of 10 $GW/cm^2$ or less.

5. The charged particle emission gun according to claim 1, wherein the cleaning photo-irradiation apparatus conducts photo-irradiation by alternately switching between light with a first wavelength for desorbing a molecule adsorbed on the tip through photon stimulated desorption and light with a second wavelength for ionizing the molecule desorbed through irradiation with the light with the first wavelength.

6. The charged particle emission gun according to claim 1, wherein the cleaning photo-irradiation apparatus irradiates the tip with the ultraviolet light or the infrared light in predetermined cycles.

7. The charged particle emission gun according to claim 1, wherein ionization of the desorbed molecule is conducted by resonance enhanced multi photon ionization (REMPI) or non-resonant multi photon ionization (NRMPI).

8. The charged particle emission gun according to claim 1, further comprising an optical fiber for guiding the ultraviolet light or the infrared light generated by the cleaning photo-irradiation apparatus toward the tip, wherein the optical fiber is coaxially arranged with the tip.

9. The charged particle emission gun according to claim 8, wherein the optical fiber is a hollow optical fiber, and an inside of the hollow optical fiber is evacuated.

10. The charged particle emission gun according to claim 1, wherein
the extracting electrode has a circumferential tapered surface formed around the central hole thereof, and
the ultraviolet light or the infrared light from the cleaning photo-irradiation apparatus is configured to, after irradiating the periphery of the tip and being reflected by the tapered surface, irradiate the tip again.

11. The charged particle emission gun according to claim 1, wherein provided that a potential of the extracting electrode is Ve, a potential of the tip is Vt, and a potential of the ion collector is Vic, the charged particle emission gun is configured as a cold cathode field emission source when the potentials are set such that Ve>Vt>Vic.

12. The charged particle emission gun according to claim 1, wherein provided that a potential of the tip is Vt, a potential of the ion collector is Vic, and a potential of the extracting electrode is Ve, the charged particle emission gun is configured as a gas field ionization ion source (GFIS) when the potentials are set such that Vt>Vic>Ve.

13. A charged particle beam apparatus comprising:
a tip;
an extracting electrode having a central hole that is coaxial with the tip;
an ion collector arranged between the tip and the extracting electrode, the ion collector having a central hole that is coaxial with the tip;
a vacuum chamber that accommodates therein the tip, the extracting electrode, and the ion collector;
a cooling apparatus for cooling the tip;
a cleaning photo-irradiation apparatus that generates ultraviolet light or infrared light to irradiate the tip; and
an optical fiber for guiding the ultraviolet light or the infrared light generated by the cleaning photo-irradiation apparatus toward the tip, the optical fiber being arranged coaxially with the tip.

14. The charged particle beam apparatus according to claim 13, wherein the optical fiber is a hollow optical fiber, and an inside of the hollow optical fiber is evacuated.

15. The charged particle beam apparatus according to claim 13, wherein
the extracting electrode has a circumferential tapered surface formed around the central hole thereof, and
the ultraviolet light or the infrared light from the cleaning photo-irradiation apparatus is configured to, after irradiating the periphery of the tip and being reflected by the tapered surface, irradiate the tip again.

16. The charged particle beam apparatus according to claim 13, wherein
the optical fiber has a first end portion facing the tip, and a second end portion connected to the cleaning photo-irradiation apparatus arranged outside the vacuum chamber, and
the second end portion is hermetically sealed and has formed thereon an optical window on which the ultraviolet light or the infrared light is incident.

17. A charged particle beam apparatus comprising:
a tip;
an extracting electrode having a central hole that is coaxial with the tip;
an ion collector arranged between the tip and the extracting electrode, the ion collector having a central hole that is coaxial with the tip;
a vacuum chamber that accommodates therein the tip, the extracting electrode, and the ion collector;
a cooling apparatus for cooling the tip;
a cleaning photo-irradiation apparatus that generates ultraviolet light or infrared light to irradiate the tip; and
an optical fiber for guiding the ultraviolet light or the infrared light generated by the cleaning photo-irradiation apparatus toward the tip, the optical fiber being arranged coaxially with the tip, wherein
the extracting electrode has a circumferential tapered surface formed around the central hole thereof, and
the ultraviolet light or the infrared light from the cleaning photo-irradiation apparatus is configured to, after irradiating the periphery of the tip and being reflected by the tapered surface, irradiate the tip again.

18. The charged particle beam apparatus according to claim 17, wherein the optical fiber is a hollow optical fiber, and an inside of the hollow optical fiber is evacuated.

19. The charged particle beam apparatus according to claim 17, wherein
the vacuum chamber has in a bottom wall thereof a hole for passage of a charged particle beam generated by the tip, and a valve that opens or closes the hole, and
the valve is closed when the ultraviolet light or the infrared light is emitted by the cleaning photo-irradiation apparatus.

20. The charged particle beam apparatus according to claim 17, further comprising a beam blanker that deflects a charged particle beam generated by the tip, wherein the blanker is operated when the ultraviolet light or the infrared light is emitted by the cleaning photo-irradiation apparatus.

* * * * *